: US 9,196,826 B2
(45) Date of Patent: Nov. 24, 2015

(54) METHOD FOR MANUFACTURING A MAGNETIC SEMICONDUCTOR MEMORY MRAM COMPRISING ETCHING A MAGNETIC TUNNEL JUNCTION LAYER FORMED ON A LOWER ELECTRODE UTILIZING AN UPPER ELECTRODE HAVING ANNULAR SHAPE

(71) Applicant: SK hynix Inc., Gyeonggi-do (KR)

(72) Inventor: Seung Hyun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/536,322

(22) Filed: Nov. 7, 2014

(65) Prior Publication Data

US 2015/0104884 A1    Apr. 16, 2015

Related U.S. Application Data

(62) Division of application No. 13/336,069, filed on Dec. 23, 2011, now Pat. No. 8,896,040.

(30) Foreign Application Priority Data

Mar. 24, 2011    (KR) ........................ 10-2011-0026277

(51) Int. Cl.
| | |
|---|---|
| G11B 5/11 | (2006.01) |
| H01L 43/12 | (2006.01) |
| H01L 27/22 | (2006.01) |
| H01L 29/82 | (2006.01) |
| G11C 11/155 | (2006.01) |
| G11C 11/16 | (2006.01) |
| H01L 43/08 | (2006.01) |
| H01L 43/02 | (2006.01) |

(52) U.S. Cl.
CPC .............. *H01L 43/12* (2013.01); *G11C 11/155* (2013.01); *G11C 11/161* (2013.01); *H01L 27/226* (2013.01); *H01L 27/228* (2013.01); *H01L 29/82* (2013.01); *H01L 43/02* (2013.01); *H01L 43/08* (2013.01)

(58) Field of Classification Search
CPC .... B82Y 25/00; G11C 11/155; G11C 11/161; H01L 27/222; H01L 27/228; H01L 43/12
USPC .......... 257/E21.665, E27.081, E27.104; 438/3
See application file for complete search history.

(56) References Cited

U.S. PATENT DOCUMENTS

| | | | | |
|---|---|---|---|---|
| 5,541,868 A * | 7/1996 | Prinz | .................... | G11C 11/155 257/E27.005 |
| 5,923,583 A * | 7/1999 | Womack | ................ | G11C 11/15 365/171 |
| 6,111,784 A * | 8/2000 | Nishimura | ............. | G11C 11/15 257/E43.004 |
| 6,956,257 B2 * | 10/2005 | Zhu | ........................ | G11C 11/16 257/295 |
| 7,109,045 B2 * | 9/2006 | Yagami | .................. | B82Y 10/00 257/E21.665 |
| 7,120,048 B2 * | 10/2006 | Sundstrom | ........... | G11C 11/155 365/158 |
| 7,307,876 B2 * | 12/2007 | Kent | ...................... | B82Y 10/00 257/E43.004 |
| 7,741,688 B2 * | 6/2010 | Kajiyama | ............. | B82Y 10/00 257/421 |

(Continued)

*Primary Examiner* — Anh Mai

(74) *Attorney, Agent, or Firm* — IP & T Group LLP

(57) ABSTRACT

A method for manufacturing a semiconductor memory device includes forming a magnetic tunnel junction layer on a lower electrode, forming a spacer having an annular shape on the magnetic tunnel junction layer, forming upper electrodes on both sidewall surfaces of the annular shaped spacer, removing the spacer, and etching the magnetic tunnel junction layer by using the upper electrodes as an etch mask.

10 Claims, 4 Drawing Sheets

(56) References Cited

U.S. PATENT DOCUMENTS

| | | | | |
|---|---|---|---|---|
| 7,919,826 B2 * | 4/2011 | Iwayama | ............... | H01L 43/12 257/295 |
| 8,000,128 B2 * | 8/2011 | Li | ............... | G11C 13/0007 365/148 |
| 8,883,520 B2 * | 11/2014 | Satoh | ............... | H01L 43/02 257/421 |
| 2003/0169147 A1 * | 9/2003 | Higo | ............... | B82Y 10/00 338/32 R |
| 2003/0183889 A1 * | 10/2003 | Kajiyama | ............... | G11C 11/155 257/421 |
| 2008/0135958 A1 * | 6/2008 | Kajiyama | ............... | B82Y 10/00 257/421 |
| 2008/0224117 A1 * | 9/2008 | Iwayama | ............... | H01L 27/226 257/4 |
| 2010/0053822 A1 * | 3/2010 | Xi | ............... | B82Y 25/00 360/324.2 |
| 2010/0301480 A1 * | 12/2010 | Choi | ............... | H01L 27/228 257/751 |
| 2012/0319221 A1 * | 12/2012 | Apalkov | ............... | H01L 43/08 257/427 |
| 2013/0244344 A1 * | 9/2013 | Malmhall | ............... | B82Y 10/00 438/3 |

* cited by examiner

METHOD FOR MANUFACTURING A MAGNETIC SEMICONDUCTOR MEMORY MRAM COMPRISING ETCHING A MAGNETIC TUNNEL JUNCTION LAYER FORMED ON A LOWER ELECTRODE UTILIZING AN UPPER ELECTRODE HAVING ANNULAR SHAPE

CROSS-REFERENCE(S) TO RELATED APPLICATIONS

This application is a division of U.S. patent application Ser. No. 13/336,069 filed on Dec. 23, 2011, which claims priority of Korean Patent Application No. 10-2011-0026277, filed on Mar. 24, 2011. The disclosure of each for the foregoing application is incorporated herein by reference in its entirety.

BACKGROUND OF THE INVENTION

The present invention relates to a semiconductor memory device and a manufacturing method thereof, and more particularly to a magneto-resistive random access memory (MRAM) and a manufacturing method thereof.

Semiconductor memory devices include Dynamic Random Access Memory (DRAM) devices. However, the DRAM devices have limitations such as being scaled down and maintaining a capacitance of capacitors that store data in the scale-down devices. To overcome the limitations of conventional DRAM devices, semiconductor memory devices structures have been developed. As one type of memory device, a Magneto-resistive Random Access Memory (MRAM) device uses the characteristics of Tunneling Magneto-Resistance (TMR). The TMR is a magneto-resistive effect that occurs in a magnetic tunnel junction (MTJ).

The MRAM device is a non-volatile memory device where data is stored by magnetic storage elements having different resistances according to a magnetic field changed by magnetic polarities of two ferromagnetic plates forming the MTJ. The MTJ is a component including two ferromagnetic plates separated by an insulating layer. A first ferromagnetic plate is a pinned layer (PL) set to have a magnetic polarity, and a second ferromagnetic player is a free layer (FL) having a polarity changed by a current passing through the layers.

When electrons passing through a first plate of the two ferromagnetic plates penetrate into the insulating layer serving as a tunneling barrier, the probability that the electrons penetrating into the insulating layer changes based on the polarity of a second plate of the two ferromagnetic plates. If the polarities of the two ferromagnetic plates are parallel (the same direction), the tunneling current is maximized. Otherwise, if the polarities of the two ferromagnetic plates are opposite, the tunneling current is minimized. The state of the tunneling current indicates what information is stored in the MTJ.

The MRAM device typically uses a Spin Transfer Torque (STT) technique to write data therein. The STT technique uses spin-aligned ("polarized") electrons to directly torque domains. The torque will be transferred to a nearby ferromagnetic plate, according to an effect that may modify the orientation of a ferromagnetic plate in a tunnel magnetoresistance or spin valve using a spin-polarized current. When the spin-polarized current flows into the ferromagnetic plate, if the magnetic orientation of the ferromagnetic plate is not the same as the polarity of the current, the magnetic orientation is aligned to the polarity of the current so that the data can be written.

In the MTJ included in the MRAM device, when electrons flow from the pinned layer to the free layer, the magnetic orientation of the free layer is aligned with that of the pinned layer by the electrons having spin aligned with the polarity of the pinned layer. Thus, the MTJ can store a first type of data. Otherwise, if electrons flow from the free layer into the pinned layer, spin accumulation occurs at boundary areas of the pinned layer and the free layer, Thus, the magnetic orientation of the free layer is oppositely aligned with that of the pinned layer so that a second type of data can be stored in the MTJ.

SUMMARY OF THE INVENTION

An embodiment of the present invention is directed to a magneto-resistive random access memory (MRAM) device including a plurality of magnetic tunnel junctions (MTJs).

In accordance with an embodiment of the present invention, a method for manufacturing a semiconductor memory device includes forming a magnetic tunnel junction layer on a lower electrode; forming a spacer having an annular shape on the magnetic tunnel junction layer; forming upper electrodes on both sidewall surfaces of the annular shaped spacer; removing the spacer; and etching the magnetic tunnel junction layer by using the upper electrodes as an etch mask.

In accordance with another embodiment of the present invention, a semiconductor memory device includes a plurality of magnetic tunnel junction elements configured to store data; and a transistor commonly connected to the plurality of magnetic tunnel junctions, wherein the plurality of magnetic tunnel junction elements includes a plurality of concentrically aligned magnetic tunnel junction layers and plurality of concentrically aligned upper electrodes over a lower electrode.

DESCRIPTION OF SPECIFIC EMBODIMENTS

Figure 1A:
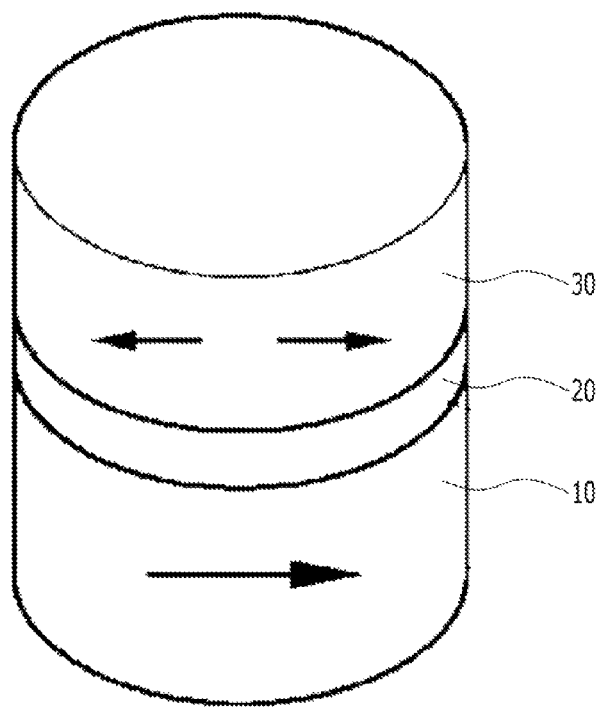
FIGS. 1A and 1B illustrate magnetic tunnel junctions (MTJs) included in a magneto-resistive random access memory (MRAM) device in accordance with an embodiment of the present invention.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1B:
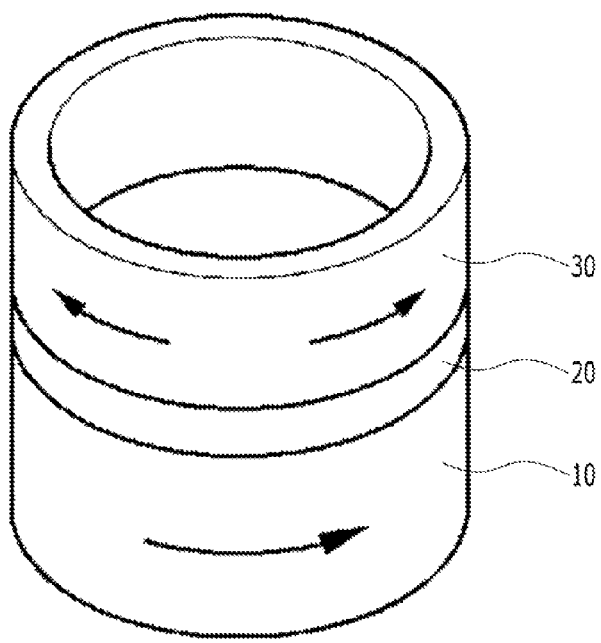

FIGS. 1A and 1B illustrate magnetic tunnel junction (MTJ) included in a magneto-resistive random access memory (MRAM) device in accordance with an embodiment of the present invention.

Referring to FIGS. 1A and 1B, the magnetic tunnel junction (MTJ) includes two magnetic layers including a pinned layer 10 and a free layer 30, separated by a tunnel barrier layer 20. The pinned layer 10 is set to a particular polarity, and the free layer 30 has a polarity that changes according to a magnetic field generated by a current. For example, if the pinned layer 10 and the free layer 30 have the same polarity, a resistance of the MTJ becomes low. If the pinned layer 10 has an opposite polarity with the free layer 30, the resistance of the MTJ becomes high. Whether the resistance is high or low may indicate whether the data stored in the MTJ has the logical value of "0" or "1.".

FIG. 1A shows an MTJ including the free layer 30, and the magnetic orientation of the MTJ in FIG. 1A is determined based on shape anisotropy. FIG. 1B describes another MTJ including the free layer 30 that has a circle shape so that the magnetic orientation of magnetization layer is a clockwise or counterclockwise circle.

The pinned layer 10 can be a plug configured to connect the tunnel barrier layer 20 to a transistor. The pinned layer 10 includes an electric conducting material such as a metal or a metallic compound.

The free layer 30 may include an electric conducting material such as a metal or a metallic compound.

FIGS. 2A to 2H illustrate a method for forming two MTJs in a magneto-resistive random access memory (MRAM) device accordance with an embodiment of the present invention.

Figure 2A:
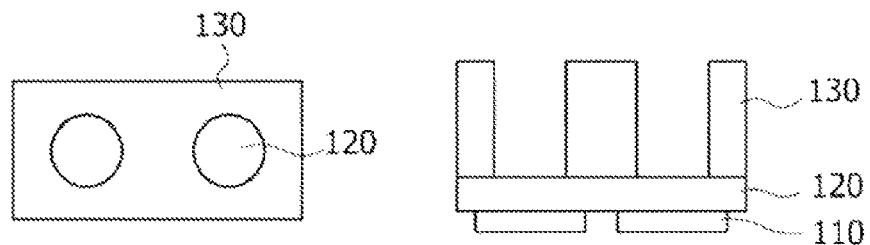
FIGS. 2A to 2H illustrate a method for forming two MTJs in a magneto-resistive random access memory (MRAM) device in accordance with an embodiment of the present invention.

Referring to 2A, a magnetic tunnel junction layer 120 is deposited on the lower electrode 110. A photo resist layer (not shown) is deposited on the magnetic tunnel junction layer 120 and a photo resist pattern 130 including a hole of a circle shape is deposited over the magnetic tunnel junction layer 120 through a lithography process. Referring to FIG. 2A, the magnetic tunnel junction layer 120 is exposed by the hole of the circle shape in the photo resist pattern 130.

In accordance with another embodiment, a photo resist pattern can be fabricated to have a cylinder shape. A magnetic tunnel junction layer is deposited on a lower electrode, and a photo resist layer is formed on the magnetic tunnel junction layer. Using a lithography process, the photo resist pattern of cylinder shape can be formed on the magnetic tunnel junction layer. In this embodiment, the magnetic tunnel junction layer is exposed between the photo resist patterns of cylinder shape.

Here, the photo resist pattern may have a cylinder shape. However, the photo resist pattern may also have a pillar shape. The flat surface of the photo resist pattern may have one shape of a circle, an oval, or a polygon.

Figure 2B:
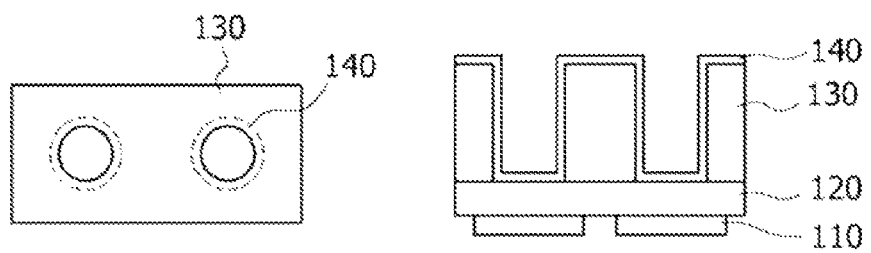

Referring to FIG. 2B, a spacer layer 140 is deposited on the magnetic tunnel junction layer 120 and the photo resist pattern 130 with a uniform thickness through a chemical vapor deposition (CVD) process. The material for the spacer layer 140 may have a high etch selectivity to prevent the loss of the magnetic tunnel junction layer 120 and the upper electrode 150 during a subsequent process. More specifically, the magnetic tunnel junction layer 120 and an upper electrode 150 have lower etch rates than the spacer layer 140. The spacer layer may include a silicon nitride (SiN), a silicon oxide (SiO), or tungsten (W).

Figure 2C:
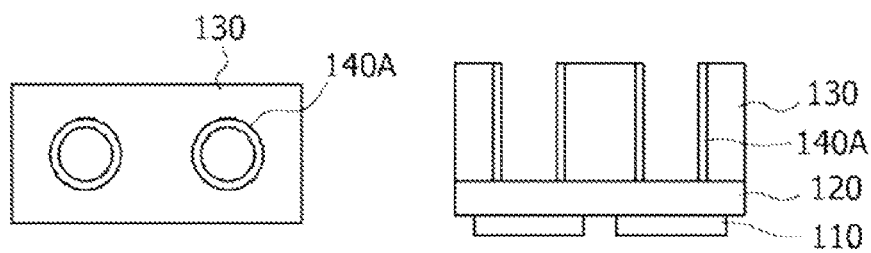

Referring to FIG. 2C, the spacer layer 140 on top of photo resist pattern 130 and on the magnetic tunnel junction layer 120 at a bottom of the hole is removed by an etch-back process performed after the spacer layer 140 is deposited as shown in FIG. 2B. More specifically, the etch-back process is performed to partially remove the spacer layer 140, until the top surface of the photo resist pattern 130 is exposed and the surface of the magnetic tunnel junction layer 120 is partially exposed through the hole of the circle shape. In this step, a spacer layer 140A is formed.

Figure 2D:
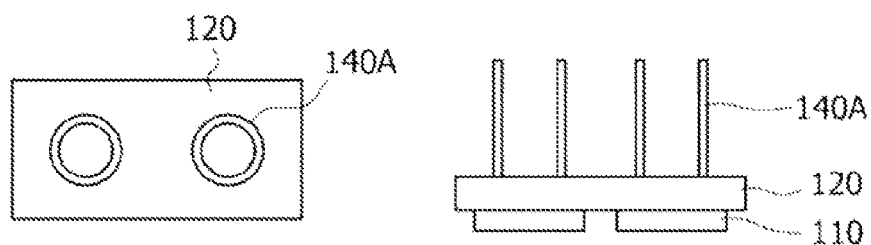

Referring to FIG. 2D, the photo resist pattern 130 is removed after the etch-back process. A process for melting down the photo resist pattern 130 is performed. If the photo resist pattern 130 is removed, the spacer 140A having a circle (or ring) shape remains on the magnetic tunnel junction layer 120.

Figure 2E:
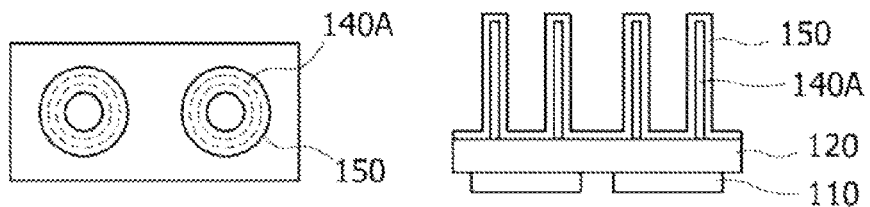

Referring to FIG. 2E, a metal layer 150 is formed after the photo resist pattern 130 is removed, The metal layer 150 is for forming an upper electrode of the MTJ. The metal layer 150 is deposited with a uniform thickness on the magnetic tunnel junction layer 120 and the spacer 140A. The metal layer 150 has a different etch selectivity than the spacer 140A, which is removed in a subsequent process. The metal layer 150 may include a titanium nitride (TiN) or a tungsten nitride (WN).

Figure 2F:
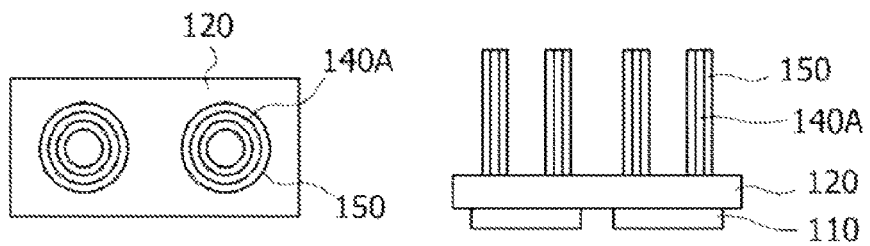

Referring to FIG. 2F, the metal layer 150 is partially removed by an etch-back process. Through the etch-back process, the metal layer 150 on top of the spacer 140A and top of the magnetic tunnel junction layer 120 is etched.

Figure 2G:
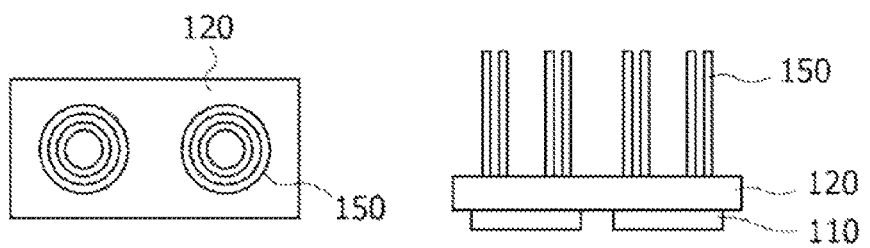

Referring to FIG. 2G, the spacer 140A is removed after the etch-back process to the metal layer 150. Because the spacer 140A includes a material having a higher etch selectivity than the magnetic tunnel junction layer 120 and the metal layer 150, loss of the magnetic tunnel junction layer 120 and the metal layer 150 can be prevented. After the spacer 140A is etched, two upper electrodes 150A concentrically aligned with each other remain on the magnetic tunnel junction layer 120.

Figure 2H:
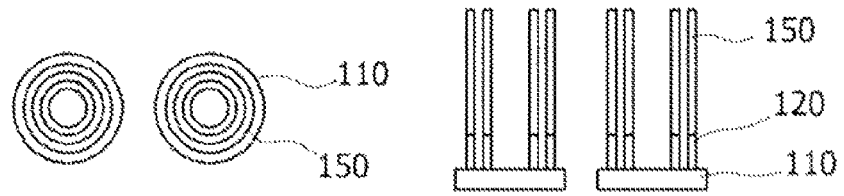

Referring to FIG. 2H, the magnetic tunnel junction layer 120 is etched using the two upper electrodes 150A as an etch mask. The two upper electrodes 150A have a lower etch rate than the magnetic tunnel junction layer 120 so that loss of the two upper electrodes 150A can be prevented. To achieve a proper etch rate during this etching process, an etching gas is properly selected. To etch the magnetic tunnel junction layer 120, the etching gas may include one or more materials of $CH_3OH$, $CO$, $NH_3$, $Cl_2$, $SF_6$, and $NF_3$.

Figure 3:
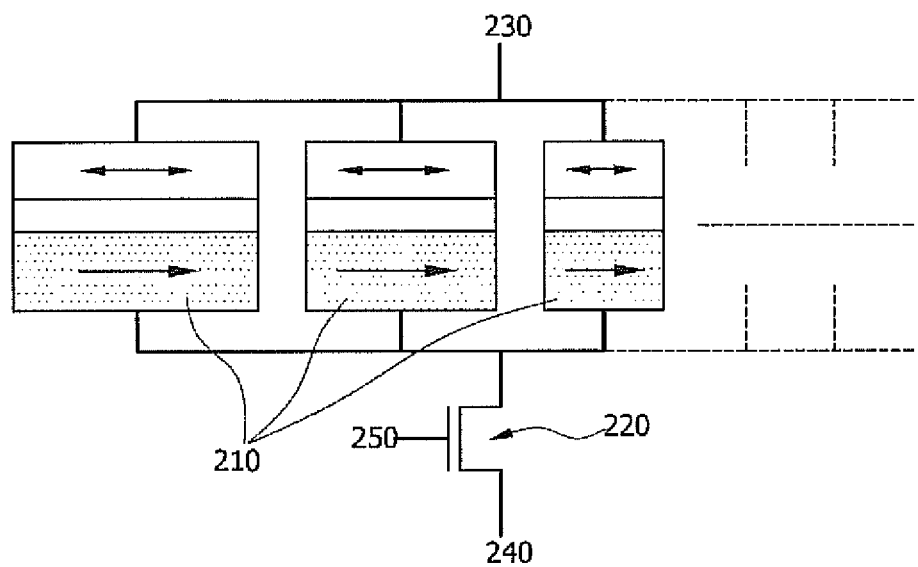
FIG. 3 illustrates an MRAM including a plurality of MTJs in accordance with an embodiment of the present invention.

FIG. 3 illustrates an MRAM including a plurality MTJs in accordance with an embodiment of the present invention.

As shown in FIG. 3, a unit memory cell includes a plurality of MTJs 210 and a transistor 220, which is coupled to a bit line 230, a source line 240, and a word line 250. The plural MTJs 210 are commonly connected to a single transistor 220. Because the unit memory cell includes the plurality of MTJs 210 so that multi-bit data can be stored in a single unit cell, integration of MRAM can be increased. The plurality of MTJs 210, concentrically aligned with each other, respectively have different tunneling characteristics. In a plane view, the plural MTJs may have a shape of a circle, an oval, or a polygon.

In a unit memory cell according to an embodiment of the present invention, a lower electrode includes one selected from the group of TiN and TaN, and an upper electrode includes one selected from the group of TiN and WN.

In a write operation, a write current supplied through the bit line 230 and the source line 240 has an influence on polarities of the plurality of MTJs 210 so that logical data based on the polarities are stored. Similarly, in a read operation, a read current passing through the plurality of MTJs 210 flows between the bit line 230 and the source line 240 so that logical data can be recognized based on a voltage gap between the bit line 230 and the source line 240.

Figure 4:
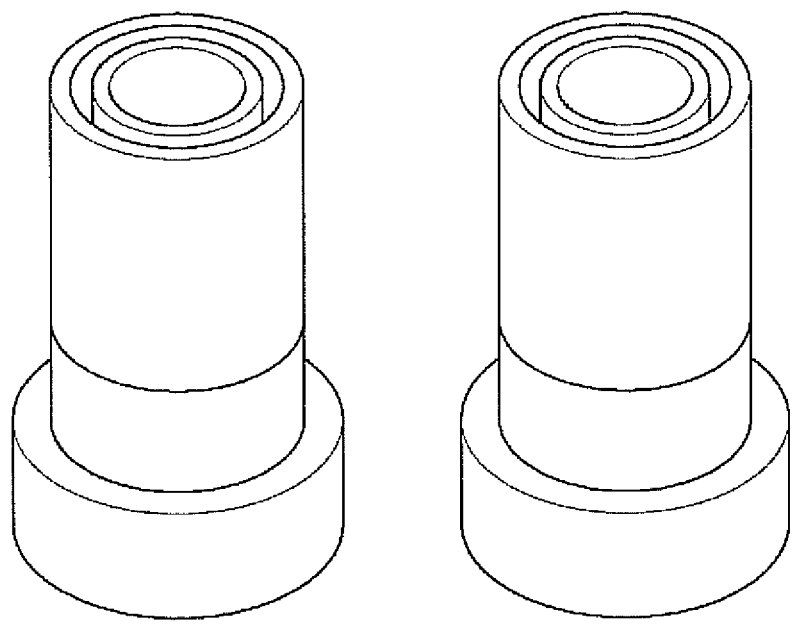
FIG. 4 illustrates the MTJ manufactured by the method shown in FIGS. 2A to 2H.

FIG. 4 illustrates the MTJ manufactured by the method shown in FIGS. 2a to 2h.

Referring to FIG. 4, over a lower electrode, a plurality of MTJs, each being a concentrically aligned and having a circle shape, are formed. The plurality of MTJs may be formed to a circle shape. In another embodiment, the plurality of MTJs may be formed in the shape of a circle, oval, and polygon in a plane view.

As discussed earlier, in accordance with embodiments of the present invention, by connecting a plurality of magnetic tunnel junctions in parallel, multi-bit data can be stored in a single storage element. Further, integration and operation speed of the non-volatile MRAM can be improved.

While the present invention has been described with respect to the specific embodiments, it will be apparent to those skilled in the art that various changes and modifications may be made without departing from the spirit and scope of the invention as defined in the following claims.

What is claimed is:

1. A method for manufacturing a semiconductor memory device, comprising:
    forming a magnetic tunnel junction layer on a lower electrode;
    forming a spacer having an annular shape on the magnetic tunnel junction layer;
    forming upper electrodes on both sidewall surfaces of the annular shaped spacer;
    removing the spacer; and
    etching the magnetic tunnel junction layer by using the upper electrodes as an etch mask.

2. The method as recited in claim 1, wherein the forming of the spacer having an annular shape comprises:
    forming a photo resist pattern having a hole on the magnetic tunnel junction layer;
    forming a layer on a top surface and both sidewalls the photo resist pattern and on the exposed magnetic tunnel junction layer in the hole;
    removing a part of the layer arranged on the magnetic tunnel junction layer and on the top surface of the photo resist pattern; and
    removing the photo resist pattern.

3. The method as recited in claim 1, wherein the forming of the spacer having an annular shape includes:
    forming a photo resist pattern having a pillar shape on the magnetic tunnel junction layer;
    forming a layer on a top surface and both sidewalls the photo resist pattern and on the exposed magnetic tunnel junction layer;
    removing a part of the layer arranged on the magnetic tunnel junction layer and on the top surface of the photo resist pattern; and
    removing the photo resist pattern.

4. The method as recited in claim 1, wherein the forming of the upper electrodes includes:
    forming a metal layer on a top surface and both sidewall surfaces the spacer and the exposed magnetic tunnel junction layer;
    removing a part of the metal layer arranged on the magnetic tunnel junction layer and a top surface of the spacer to form the upper electrodes; and
    removing the spacer.

5. The method as recited in claim 1, wherein the spacer, the magnetic tunnel junction layer, and the upper electrode have different etching selectivity.

6. The method as recited in claim 5, wherein the spacer includes at least one selected from the group of SiN, SiO, and tungsten (W).

7. The method as recited in claim 1, wherein the upper electrodes has a lower etch rate than the magnetic tunnel junction layer.

8. The method as recited in claim 7, wherein the upper electrodes includes one selected from the group of TiN and WN.

9. The method as recited in claim 1, wherein the lower electrode includes at least one selected from the group of TiN and TaN.

10. The method as recited in claim 1, wherein the spacer includes a plurality of patterned spacers, each patterned spacers having a concentric circle-shape, and the upper electrodes are arranged on both surfaces of the plurality of patterned spacers.

* * * * *